(12) United States Patent
Strehmel et al.

(10) Patent No.: US 7,569,329 B2
(45) Date of Patent: *Aug. 4, 2009

(54) METHOD FOR MAKING A LITHOGRAPHIC PLATE

(75) Inventors: Bernd Strehmel, Berlin (DE); Ulrich Fiebag, Nienstadt (DE); Tanja Ebhardt, Osterode (DE); Harald Baumann, Osterode/Harz (DE)

(73) Assignee: Kodak Graphic Communications GmbH, Osterode (DE)

( * ) Notice: Subject to any disclaimer, the term of this patent is extended or adjusted under 35 U.S.C. 154(b) by 146 days.

This patent is subject to a terminal disclaimer.

(21) Appl. No.: 11/573,901

(22) PCT Filed: Aug. 25, 2005

(86) PCT No.: PCT/EP2005/009203

§ 371 (c)(1),
(2), (4) Date: Feb. 19, 2007

(87) PCT Pub. No.: WO2006/021447

PCT Pub. Date: Mar. 2, 2006

(65) Prior Publication Data

US 2008/0092763 A1   Apr. 24, 2008

(30) Foreign Application Priority Data

Aug. 27, 2004 (DE) .................. 10 2004 041 610

(51) Int. Cl.
*G03F 7/26* (2006.01)
*G03C 1/00* (2006.01)

(52) U.S. Cl. ................... 430/302; 430/270.1
(58) Field of Classification Search ............ 430/270.1
See application file for complete search history.

(56) References Cited

U.S. PATENT DOCUMENTS

| | | | |
|---|---|---|---|
| 6,294,318 B1* | 9/2001 | Matsumoto et al. | 430/331 |
| 2002/0187427 A1* | 12/2002 | Fiebag | 430/292 |
| 2004/0067439 A1* | 4/2004 | Zhong et al. | 430/273.1 |
| 2004/0191673 A1* | 9/2004 | Sakata | 430/270.1 |
| 2008/0092763 A1* | 4/2008 | Strehmel et al. | 101/467 |
| 2008/0160444 A1* | 7/2008 | Fiebag et al. | 430/270.1 |
| 2008/0206666 A1* | 8/2008 | Baumann et al. | 430/270.1 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

A process for the post-treatment of an imaged lithographic printing plate comprises (a) Contacting a lithographic printing plate having image areas and non-image areas on a lithographic substrate with a solution comprising at least one phosphono-substituted siloxane of the following general formula (I) that is defined herein and (b) drying.

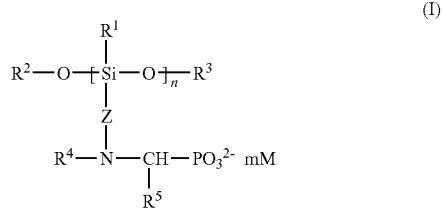

13 Claims, 6 Drawing Sheets

METHOD FOR MAKING A LITHOGRAPHIC PLATE

Figure 1:
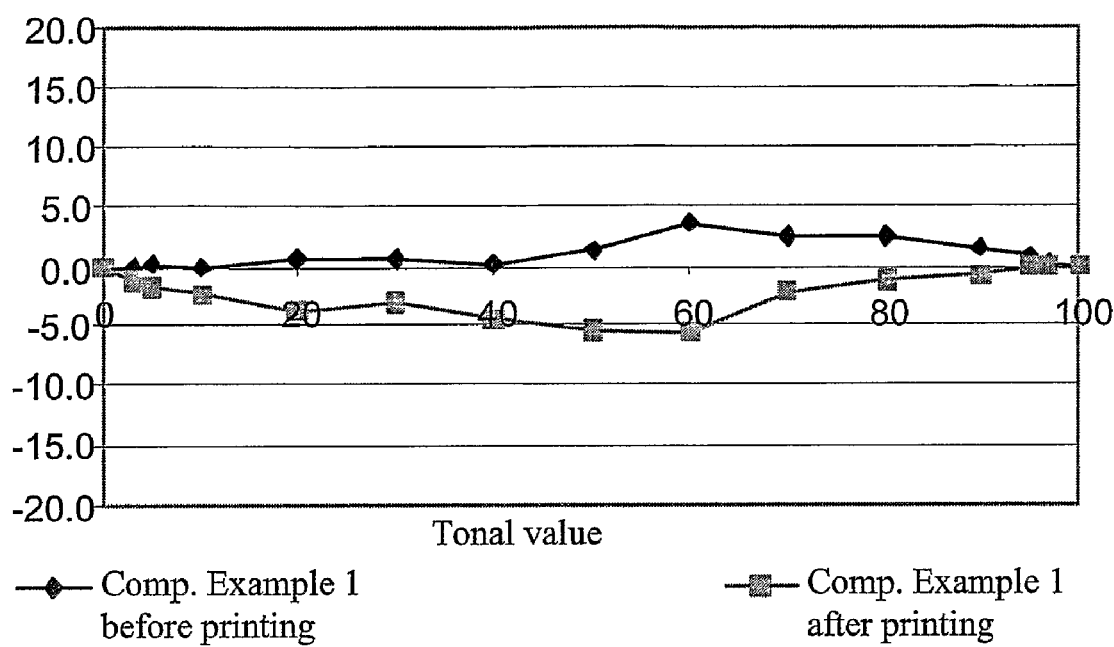

The present invention relates to a process for the production of lithographic printing plates, in particular to a process for treating a developed lithographic printing plate with a phosphono-substituted siloxane. The invention furthermore relates to lithographic printing plates produced according to this process.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as "blanket", which then in turn transfers the printing ink onto the surface of the material on which the image is to be formed; this technique is referred to as offset lithography.

Usually, a lithographic printing plate precursor (in this context the term "printing plate precursor" refers to a coated printing plate prior to exposure and developing) comprises a radiation-sensitive coating applied onto a substrate, usually on aluminum basis. If a coating reacts to radiation such that the exposed portion becomes so soluble that it is removed during the developing process, the plate is referred to as "positive working". On the other hand, a plate is referred to as "negative working" if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure. Usually, an aqueous, strongly alkaline developer is used to remove the more soluble portions of the coating.

Usually, a substrate, in particular an aluminum substrate with aluminum oxide layer, is provided with a hydrophilic protective layer (also referred to as "interlayer") before the radiation-sensitive layer is applied. This hydrophilic layer improves the water acceptance of the (non-printing) background areas of a lithographic printing plate or improves the repulsion of the printing ink in these areas. A suitable protective layer also ensures that during developing the soluble portions of the radiation-sensitive layer are removed easily and residue-free from the substrate so that clean background areas are obtained during printing. Without such a residue-free removal, what is referred to as toning would occur during printing, i.e. the background areas would accept printing ink. The interlayer should also protect the aluminum oxide layer against corrosion during developing with a strongly alkaline developer (pH value >11.5) and against permanent adsorption, e.g. of dyes used in the radiation-sensitive layer (what is referred to as "staining").

Document DE 25 327 69 A1 describes lithographic printing plate precursors on the basis of negative diazo resins having a sodium silicate interlayer. While the adhesion of the image areas to this interlayer is very good, it has been found that the photosensitivity of these plates is greatly affected by storage at elevated temperatures and humidity. Furthermore, the process of applying the interlayer poses problems, for example, drying of the alkaline sodium silicate solution on parts of the apparatus leads to residues which are hard to remove.

The use of polyvinylphosphonic acid or salts thereof as well as copolymers of vinylphosphonic acid with acrylic monomers as interlayers in lithographic printing plate precursors is e.g. suggested in DE 11 34 093 C, U.S. Pat. No. 4,153,461 and EP 0 537 633 B1. However, such a layer does not provide optimum protection for the aluminum oxide layer so that sludging of the developer takes place; furthermore, such printing plates have a tendency to cause toning after the printing machine is re-started.

For a clean printed image it is necessary that the image areas (i.e. the image-wise remaining coating) accept the printing ink well while the non-image areas (i.e. the image-wise exposed substrate, such as e.g. an aluminum substrate) are not supposed to accept the printing ink. In order to protect the image-wise exposed substrate, such as e.g. an aluminum substrate, against finger prints, the formation of aluminum oxide and corrosion, as well as against mechanical damage such as scratches when the printing plate is mounted onto the printing machine, i.e. in order to maintain and possibly improve the hydrophilia of the non-image areas, the developed printing plate is usually subjected to a "gumming" treatment (also referred to as "finishing"). Gumming a plate before storage or prior to long periods of downtime on the printing machine ensures that the non-image areas remain hydrophilic and thus toning is prevented. During printing, the gumming then has to be able to be removed quickly by the fountain solution used during the printing process so that the image areas are able to accept ink immediately. Gumming solutions have been known for a long time and are often based on gum arabic (e.g. DE 29 26 645 A1).

U.S. Pat. No. 4,880,555 describes a "finisher" for lithographic printing plates comprising maltodextrin prepared by enzymatic hydrolysis, a polyol, hydrocarbons, a mixture of long-chain alcohol and aminated alcohol sulfate, substituted phenoxypoly(oxyethylene)ethanol and an ethanolamine.

U.S. Pat. No. 4,033,919 describes an aqueous gumming solution comprising a polymer which comprises units derived from acrylamide and 1 to 25 wt.-% of units with carboxy groups. The solution furthermore comprises an acidic material such as phosphonic acid, citric acid and tartaric acid. The documents U.S. Pat. No. 4,143,021 and DE 25 045 94 A1 also describe an aqueous gumming solution comprising a polymer or copolymer on the basis of polyacrylamide.

Document EP 0 985 546 A1 suggests the use of a compound of the following formula

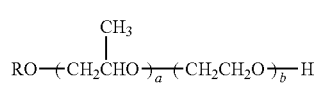

(wherein a and b independently represent an integer from 1 to 50 and R is an alkyl group with 8 to 22 carbon atoms) in a gumming solution for lithographic printing plates or in the fountain solution.

EP 1 260 866 A2 explains that it is possible to rinse the developer used for developing from a lithographic printing plate and to carry out a gumming process at the same time. For this purpose, the printing plate is brought into contact with rinsing water comprising (a) at least one film-forming water-soluble polymer and (b) at least one phosphonic acid derivative

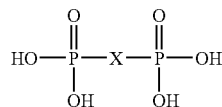

EP 0 943 967 A2 and DE 29 25 363 A1 describe emulsion-type gumming solutions.

It is the object of the present invention to provide a process for the production of a lithographic printing plate and for the post treatment of a (developed) lithographic printing plate increasing the adhesion of the image areas to the substrate, resulting in a higher sensitivity and a lower dot gain during printing, without interfering with the delicate equilibrium between printing ink and water and without causing problems such as toning upon re-starting the printing machine.

This object is achieved by a process wherein after image-wise exposure and developing a solution is applied which comprises a phosphono-substituted siloxane of the general formula (I)

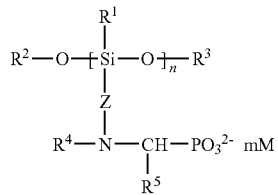

wherein
- $R^1$ is selected from a hydrogen atom, a hydroxy group, a linear or branched $C_1$-$C_{20}$ alkyl, linear or branched $C_2$-$C_{20}$ alkenyl, linear or branched $C_1$-$C_{20}$ alkoxy, linear or branched $C_2$-$C_{20}$ alkinyl, aryl, arylalkyl, alkylaryl, arylalkenyl, alkenylaryl, arylalkinyl, alkinylaryl, acyloxy group and a group —$CHR^6$—$PO_3^{2-}$,
- $R^1$ and $R^3$ are independently selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, and alkinylaryl group,
- $R^4$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- $R^5$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$;
- Z represents —$(CR^6R^7)_x$— or arylene, or a combination of two or more thereof,
- $R^6$ and $R^7$ are independently selected from a hydrogen atom, a linear or branched $C_1$-$C_6$ alkyl, linear or branched $C_2$-$C_6$ alkenyl, linear or branched $C_2$-$C_6$ alkinyl, aryl, arylalkyl, alkylaryl, arylalkenyl, alkenylaryl, arylalkinyl and alkinylaryl group,
- n is an average value and has a value from 1 to 200 and
- x is an integer from 1 to 100,
- M represents the counterion(s) needed for charge equalization and is selected from monovalent, divalent or multivalent cations, and
- m is the number of cations needed for charge equalization.

The object is also achieved by an alternative process wherein the oleophilic image areas are image-wise applied onto a lithographic substrate and subsequently the above-described solution is applied.

As used in the present invention, the term "printing plate precursor" refers to an unimaged plate (i.e. a plate that has not been image-wise exposed and developed), from which a printing plate is produced by image-wise exposure and optionally developing. As used in the present invention, the term "printing plate" refers to an imaged plate (also referred to as "printing form") produced from a printing plate precursor.

FIGS. 1 to 6 graphically illustrate the dot gain at various tonal values before and after printing as determined in Comparative Example 1, Example 1, Comparative Example 4, Example 4, Example 7 and Comparative Example 5.

For the inventive post treatment of a lithographic printing plate, a phosphono-substituted siloxane of general formula (I) is used

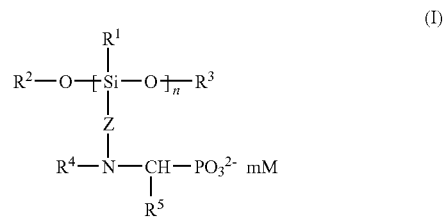

wherein
- $R^1$ is selected from a hydrogen atom, a hydroxy group, a linear or branched $C_1$-$C_{20}$ alkyl, linear or branched $C_2$-$C_{20}$ alkenyl, linear or branched $C_1$-$C_{20}$ alkoxy, linear or branched $C_2$-$C_{20}$ alkinyl, aryl, arylalkyl, alkylaryl, arylalkenyl, alkenylaryl, arylalkinyl, alkinylaryl, acyloxy group and a group —$CHR^6$—$PO_3^{2-}$,
- $R^2$ and $R^3$ are independently selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, and alkinylaryl group,
- $R^4$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- $R^5$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- Z represents —$(CR^6R^7)_x$— or arylene, or a combination of two or more thereof,
- $R^6$ and $R^7$ are independently selected from a hydrogen atom, a linear or branched $C_1$-$C_6$ alkyl, linear or branched $C_2$-$C_6$ alkenyl, linear or branched $C_2$-$C_6$ alkinyl, aryl, arylalkyl, alkylaryl, arylalkenyl, alkenylaryl, arylalkinyl and alkinylaryl group,
- n is an average value and has a value from 1 to 200 (preferably 1 to 100) and
- x is an integer from 1 to 100 (preferably 1 to 50, especially preferred 1 to 10),
- M represents the counterion(s) needed for charge equalization and is selected from monovalent, divalent or multivalent cations, and
- m is the number of cations needed for charge equalization.

Preferably, the phosphono-substituted siloxane has the general formula (II)

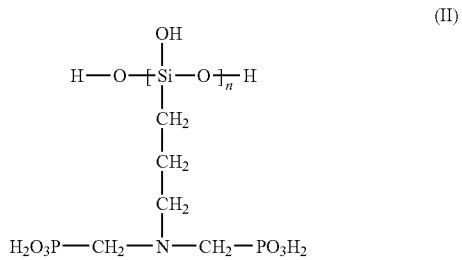

wherein n is an average value and has a value from 1 to 100.

Depending on the pH value, the siloxane of formula (I) or (II) can also be protonated at the N atom. Thus, whenever reference is made to formula (I) or (II) in this application, the protonated species should be encompassed as well.

Protons as well as alkali or alkaline earth metal ions, ammonium ions or phosphonium ions can for example be used as counterion M. In the case of protons, the compound is then present as a free acid. In an acidic medium (pH range between 1 and 3), the free acids can also be present as acid addition salts, e.g. as hydrochlorides, sulfates etc. At the isoelectric point, betaine-type structures can be present.

When the counterion M is a transition metal cation, the formation of a complex can take place, i.e. there is no actual salt structure. Such complexes are encompassed by the present invention as well.

One way of preparing the phosphono-substituted siloxanes of the present invention is the reaction of a suitable aminosiloxane with formaldehyde or another suitable carbonyl compound and phosphorous acid, whereby the phosphorous acid can for example be prepared by controlled hydrolysis of suitable halogenated phosphorus compounds in situ, e.g. from $PCl_3$.

Such a reaction takes place according to the following reaction scheme (see also Topics in phosphorous chemistry, 8 (1977), pages 527-529):

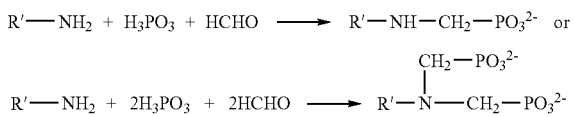

wherein R' carries one or more siloxane groups.

The lithographic substrate is a dimensionally stable plate or foil-shaped material. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metalized by vapor deposition. Among these substrates, an aluminum plate or foil is especially preferred since it shows a remarkable degree of dimensional stability and is inexpensive. Furthermore, a composite film can be used wherein an aluminum foil has been laminated onto a plastic film, such as e.g. a polyethylene terephthalate film, or paper, or a plastic film onto which aluminum has been deposited by means of vapor deposition.

A metal substrate, in particular an aluminum substrate, is preferably subjected to at least one treatment selected from graining (e.g. by brushing in a dry state or brushing with abrasive suspensions, or electrochemical graining, e.g. by means of hydrochloric acid or $HNO_3$) and anodizing (e.g. in sulfuric acid or phosphoric acid).

The substrate can also be subjected to the application of a hydrophilizing layer by applying an interlayer of polyvinylphosphonic acid or a silicate onto one or two sides of the substrate; in the present invention it is preferred that no interlayer is present and that the oxide pores of the anodic layer are substantially unsealed.

The details of the above-mentioned substrate pretreatment are known to the person skilled in the art.

An aluminum foil which preferably has a thickness of 0.1 to 0.7 mm, more preferred 0.15 to 0.5 mm, is an especially preferred substrate. It is preferred that the foil be grained (preferably electrochemically) and then show an average roughness of 0.2 to 1 μm, especially preferred 0.3 to 0.8 μm.

According to an especially preferred embodiment, the grained aluminum foil was furthermore anodized. The layer weight of the resulting aluminum oxide is preferably 1.5 to 5 $g/m^2$, especially preferred 2 to 4 $g/m^2$.

The inventive post treatment of lithographic printing plates is suitable for all types of lithographic printing plates, i.e. both those produced from positive working precursors and those produced from negative working precursors, wherein the printing plate precursors can either be UV/VIS-sensitive (i.e. sensitive to radiation selected from the wavelength range of 320 to 750 nm) or IR-sensitive (i.e. sensitive to radiation selected from the wavelength range of more than 750 nm to 1,600 nm, preferably more than 750 nm to 1,350 nm) or heat-sensitive. The precursors can either be single-layer precursors or precursors having a multi-layer structure.

The radiation-sensitive coating can for example be a negative working UV-sensitive coating on the basis of negative diazo resins as described, inter alia, in EP 0 752 430 B1, a negative working photopolymer layer sensitive to radiation of about 405 nm (see e.g. DE 103 07 451.1), a negative working photopolymer system sensitive to radiation from the visible range of the spectrum (e.g. EP 0 684 522 B1) or a negative working IR-sensitive layer based on free-radical polymerization (e.g. DE 199 06 823 C2).

Furthermore, the radiation-sensitive coating can be a positive working UV-sensitive layer based on quinone diazides and novolaks, as described in U.S. Pat. No. 4,594,306, or a positive working IR-sensitive layer on the basis of a mixture of novolaks and IR dyes (see also EP 0 887 182 B1 and EP 1 101 607 A1).

Furthermore, the printing plate precursor used in the production of the printing plates can be a negative working single-layer IR-sensitive element wherein the radiation-sensitive layer is rendered insoluble in or impenetrable by aqueous alkaline developer upon IR irradiation and preferably comprises (i) at least one compound which forms an acid upon IR irradiation (in the following also referred to as "latent Bronsted acid"), and (ii) a component cross-linkable by an acid (in the following also referred to as "cross-linking agent") or a mixture thereof and optionally (iii) a binder resin or a mixture thereof.

Such systems are for example described in EP 0 625 728 B1 and EP 0 938 413 B1.

Positive working dual-layer elements comprising, on the hydrophilic surface of the substrate, a first layer soluble in aqueous alkaline developer whose solubility is not changed by IR irradiation, and on top of that layer a top layer insoluble in aqueous alkaline developer which is rendered soluble in or penetrable by the developer upon IR irradiation can also be used as printing plate precursors.

Known principles can be applied for the top layer:

(a) A polymer insoluble in strongly alkaline aqueous developer (pH>11) is used which is rendered soluble in or penetrably by the developer by IR irradiation; such systems are for example described in U.S. Pat. No. 6,352,812.

(b) A polymer soluble in strongly alkaline aqueous developer (pH>11) is used whose solubility is reduced to such a high degree by the simultaneously present solubility inhibitor that the layer is not soluble or penetrable under developing conditions; the interaction between the polymer and the inhibitor is weakened by IR radiation to such a degree that the irradiated (heated) areas of the layer are rendered soluble in or penetrable by the developer. Such systems are for example described in U.S. Pat. No. 6,352,811 and U.S. Pat. No. 6,358,669. It is not necessary that the polymer and the solubility inhibitor be two separate compounds, but polymers can be used which at the same time have a solubility inhibiting effect, such as e.g. the functionalized resins described in US 2002/0,150,833 A1, U.S. Pat. No. 6,320,018 B and U.S. Pat. No. 6,537,735 B, such as e.g. functionalized novolaks.

(c) A polymer insoluble in aqueous alkaline developer with pH<11 (but soluble at pH>11) is used, which upon IR irradiation becomes soluble in such a developer with pH<11, and the irradiated element is developed with an alkaline developer with pH<11. Such a system is for example described in WO 02/14071.

According to one embodiment of the present invention, a lithographic printing plate is produced according to a process comprising (a) image-wise irradiating a lithographic printing plate precursor having a radiation-sensitive layer applied to a lithographic substrate, (b) removing the non-image areas from the image-wise irradiated precursor by means of an alkaline developer, (c) treating the developed printing plate with a solution comprising a phosphono-substituted siloxane as described above.

The radiation-sensitive composition can be applied to the surface of the substrate by means of common methods such as e.g. spin coating, dip coating, spray coating and coating by means of doctor blades. It is possible to apply the radiation-sensitive composition on both sides of the substrate; however, an application on only one side of the substrate is preferred.

The substrate preferably does not comprise an interlayer. A grained and anodized aluminum foil without interlayer is especially preferred, preferably the oxide pores of the anodic layer are substantially unsealed.

Depending on the sensitizer used in the composition, the printing plate precursor is image-wise exposed with UV radiation, VIS radiation or IR radiation.

Depending on whether the layer is a positive working radiation-sensitive layer or a negative working radiation-sensitive layer, the exposed or non-exposed areas are subsequently removed with a developer (preferably an aqueous alkaline developer) which results in printing image areas and non-printing background areas.

According to an alternative embodiment, it is also possible to apply the printing oleophilic areas image-wise to the substrate (e.g. by means of inkjet processes, thermo transfer processes and toner transfer processes) so that image-wise irradiation and developer are no longer necessary.

For the post treatment of the imaged lithographic printing plate according to the present invention a solution of the phosphono-substituted siloxane, preferably with a concentration of 0.01 to 15 wt.-%, based on the solvent, more preferred 0.1 to 5 wt.-%, and especially preferred 0.3 to 3 wt.-%. This solution is then applied using common coating processes such as e.g. dip coating, roller coating, spray coating, coating with doctor blades and coating with a slot coater. The solvent used in this process has a temperature of preferably 20 to 90° C. Dipolar aprotic solvents (such as DMF, DMSO, NMP and THF) can be used, as well as protic solvents (such as $C_1$-$C_4$ alkanols), water and mixtures of the above solvents.

In addition to the phosphono-substituted siloxane, the solution can furthermore contain common additives such as thickening agents, surfactants, bactericides, fungicides etc.

If desired, an excess of solution can be removed by means of a doctor blade, a squeeze roll or by rinsing with water (preferably at a temperature of 20 to 80° C.) after a sufficiently long dwell time of the solution of the substrate.

The printing plate treated with the solution is then dried, for example in the air or by means of a hot-air dryer or an infrared dryer. Drying is preferably carried out at a temperature of 20 to 120° C., especially preferred 20 to 80° C.

If desired, a common gumming process can be carried out after the after treatment with the phosphono-substituted siloxane, e.g. the application of an aqueous solution containing gum arabic by means of common methods (e.g. roller coating).

However, according to an alternative embodiment, the solution of the phosphono-substituted siloxane used for the after treatment can additionally contain gum arabic or another gumming agent so that post treatment and gumming are carried out in one step.

The present invention is described in more detailed in the following examples; however, they are not intended to restrict the invention in any way.

EXAMPLES

Reference Example

Preparation of Phosphono-substituted Siloxane of Formula II 460 g $H_3PO_3$ (70%) and 660 g HCl (31%) are mixed at room temperature in a 5 l glass vessel, equipped with a stirrer and a thermostat, and stirred for about 10 minutes. Then 1,200 g of a 22.5% aqueous solution of polycondensated 3-aminopropyltrihydroxysilane are added drop-wise over a time period of 3 hours. During that time, the temperature is held between 60° C. and 70° C. Then the mixture is heated in a pressure reactor to 100 to 109° C. and 166 g paraformaldehyde are slowly added (within 3 h). Then the phosphonomethylation reaction is allowed to proceed for 2 hours at that temperature. Afterwards, liquid is distilled off under atmospheric pressure to a weight loss of 1,300 g in order to reduce the chloride content and remove excess of formaldehyde. The solid content of the remaining high viscous solution was determined as 50.7 wt %.

Result of the elemental analysis of the product:

| | |
|---|---|
| C | 18.46% |
| H | 4.92% |
| N | 4.31% |
| P | 19.08% |
| Si | 8.92% |

P/Si ratio = 2.14

After the synthesis, the compound mentioned above is present in an aqueous solution as a free acid and in a polymerized state.

The structure of the obtained phosphono-substituted siloxane was found to be as follows:

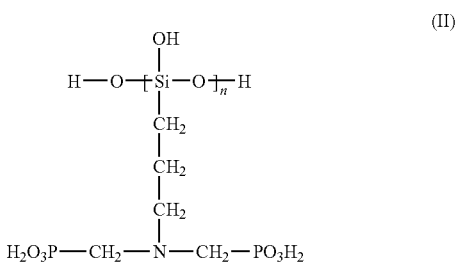

(II)

with n being an average value and having a value of 1 to 100.

The synthesis described above can be used to prepare all the siloxanes suitable for use in the present invention by adjusting the parameters accordingly.

Another advantageous variant of the synthesis is based on the use of other strong inorganic acids instead of hydrochloric acid, such as e.g. sulfuric acid.

Production of Substrate 1

(Substrate with Polyvinylphosphonic Acid Interlayer)

An electrochemically grained (with HCl, average roughness 0.6 μm) and anodized aluminum foil (weight of the oxide layer 3.2 g/m²) was subjected to an after treatment with an aqueous solution of 1.5 g/l polyvinylphosphonic acid (PVPA) for 10 s at 50° C. resulting in an interlayer consisting of 15 mg/m² PVPA on the aluminum substrate.

Productions of Substrate 2

(Substrate without Interlayer)

An electrochemically grained (with HCl, average roughness 0.6 μm) and anodized aluminum foil (weight of the oxide layer 3.2 g/m²) was produced; no interlayer was applied.

Examples 1 to 3 and Comparative Examples 1 to 3

Lithographic Printing Plate Precursors with UV-Sensitive Photopolymer Layer

A UV-sensitive filtered coating solution as described in Table 1 was applied onto the substrate listed in Table 2 and dried for 4 minutes at 90° C. The dry layer weight of the photopolymer layer was about 1.5 g/m².

TABLE 1

| | |
|---|---|
| 1.02 g | of a terpolymer prepared by polymerization of 470 parts by weight styrene, 336 parts by weight methyl methacrylate and 193 parts by weight methacrylic acid, 30% solution in propylene glycol monomethylether |

TABLE 1-continued

| | |
|---|---|
| 0.1 g | Kayamer PM-2 ® (1 mole phosphoric acid esterified with 1.5 moles hydroxyethyl methacrylate) |
| 0.2 g | mercapto-3-triazole |
| 3.92 g | of an 80% methyl ethyl ketone solution of a urethane acrylate prepared by reacting Desmodur N 100 ® with hydroxyethyl acrylate and pentaerythritol triacrylate; amount of double bonds: 0.5 double bonds per 100 g when all isocyanate groups have completely reacted with the acrylates containing hydroxy groups |
| 0.45 g | ditrimethylolpropane tetraacrylate |
| 1.25 g | of a dispersion in propylene glycol monomethylether comprising 7.25 wt.-% copper phthalocyanine and 7.25 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 3-formylbenzoic acid |
| 0.25 g | 2-phenyl-4-(2-chlorophenyl)-5-(4-diethylaminophenyl)-oxazole |
| 0.175 g | 2,2-bis(2-chlorophenyl)-4,5,4',5'-tetraphenyl-2'H-[1,2']-biimidazolyl |
| 20 ml | propylene glycol monomethylether |
| 16 ml | methanol |
| 25 ml | methyl ethyl ketone |

The obtained samples were coated with a top coat by applying an aqueous solution of poly(vinylalcohol) (degree of hydrolysis: 88%); after drying for 4 minutes at 90° C., the top layer had a dry layer weight of about 3 g/m².

The printing plate precursor was exposed with an imagesetter (Andromeda® A750M from Lithotech, equipped with a laser diode emitting at 405 nm, 30 mW, cw operation). A UGRA gray scale V2.4 with defined tonal values (all data was linearized in order to approximately obtain the desired tonal value) was exposed onto the plate precursor described above. Additionally, the sensitivity of the plate was determined using an UGRA gray scale 85 under overall exposure. Immediately after exposure, the plate was heated in an oven for 2 minutes to 90° C.

Then the exposed and thermally treated plate was treated for 30 seconds with a developer solution having a pH value of about 12 and containing KOH as alkaline component and poly(oxyethylene)-2-naphthyl ether.

Then the developer solution was again rubbed over the surface for another 30 seconds using a tampon and then the entire plate was rinsed with water. After this treatment, the exposed portions remained on the plate.

The developed plates were treated according to the present invention with a siloxane solution; the siloxane used was prepared in accordance with the Reference Example. For this post treatment, the entire plate, i.e. image areas and non-image areas, were carefully rubbed with a tampon moistened with the corresponding solution and then dried at room temperature. Then an aqueous gumming solution (0.5% H₃PO₄, 6% gum arabic) was applied using standard processes.

Details regarding the substrates, polymers, solvents for the siloxane solutions and gumming used in the examples as well as the results obtained with respect to sensitivity, relative dot gain and toning can be inferred from Table 2.

In Example 3, the developed plate was treated with a gumming solution which also contained the siloxane, i.e. after treatment and gumming were carried out in a single step. Details can be inferred from Table 2 as well.

The relative dot gain and the sensitivity were determined as follows:

The plates were mounted in a sheet-fed offset printing machine and used for printing with an abrasive printing ink (Offset S7184 from Sun Chemical, containing 10% $CaCO_3$).

The term "dot gain" describes the change in the tonal values of a linearized plate during printing. Linearization means that a digital plate is exposed such that a predetermined set tonal value (STV) is approximately obtained. The accessible measured values are the tonal values (TV). They are exposed onto the linearized plate in different magnitudes (index i in formula 1) resulting in a differentiated image with respect to the tonal values after developing, depending on the selection of these magnitudes. Thus, a series of data of tonal values before printing (TVB) is obtained. The linearized, developed and, according to the present invention, post treated printing plate is used in a printing machine for 10,000 prints, cleaned and then again subjected to a tonal value examination, which shows the tonal values after printing (TVA). Then the dot gain is calculated using equation (1).

$$\text{Dot gain} = \sum_i ((TVB[i] - STV[i]) + (TVA[i] - STV[i])) \quad (1)$$

The dot gain can have either a positive or a negative sign. It is merely the absolute value which is of interest for practical printing applications, which in an ideal case should converge towards zero.

In other words: The lower the dot gain, the better the plate.

The plate of Comparative Example 1, i.e. a plate with considerable dot gain during printing at different tonal values, is used as a reference. The relative dot gain is calculated using equation (2) below:

$$\text{relative dot gain} = \frac{\text{dot gain (sample)}}{\text{dot gain (reference)}} \cdot 100\% \quad (2)$$

Figure 2:
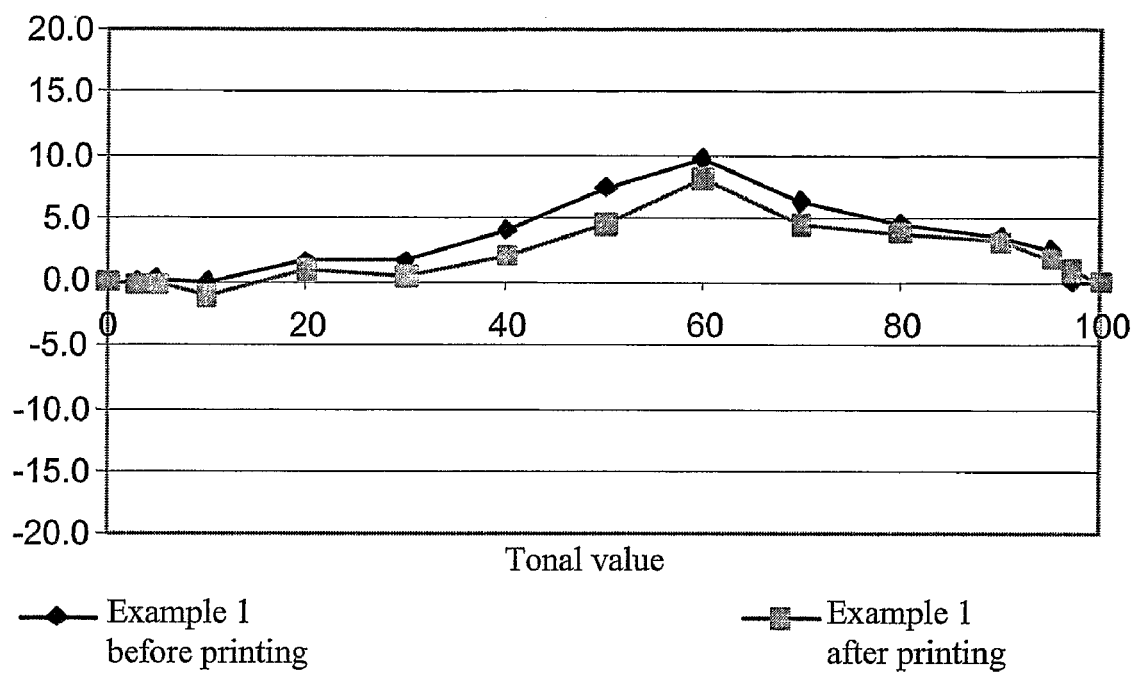

FIGS. 1 and 2 graphically illustrate the dot gain at different tonal values before printing and after 10,000 runs on the printing machine (i.e. 10,000 copies) for Comparative Example 1 and Example 1. The relative dot gain in FIG. 1 (Comparative Example 1) was assumed to be 100%; the relative dot gain in FIG. 2 (Example 1) was calculated to be 28%, which is a clear improvement compared to Comparative Example 1.

TABLE 2

| Example | Substrate | Post-treatment[1] | Solvent[2] | Finishing[3] | Sensitivity[4] | Relative dot gain[5] |
|---|---|---|---|---|---|---|
| Comp. 1 | Substrate 1 | none | — | Gumming | 4 | 100 |
| Comp. 2 | Substrate 2 | PVPA (2%) | $H_2O$ | Gumming | 6 | Toning; ink acceptance problems |
| Comp. 3 | Substrate 2 | none | — | Gumming | 6 | Toning |
| 1 | Substrate 2 | Siloxane (2%) | $H_2O$ | Gumming | 6 | 28 |
| 2 | Substrate 2 | Siloxane (1%) | $H_2O$ | Gumming | 6 | 21 |
| 3 | Substrate 2 | none | — | Siloxane + Gumming | 6 | 25 |

[1] "Posttreatment" means that the developed plate was treated with an aqueous solution of the mentioned compound. The siloxane used was prepared according to the reference example and had the following structure:

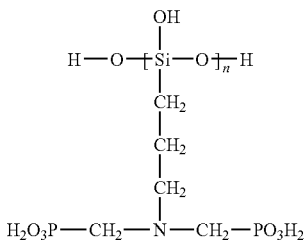

(II)

[2] The listed solvent was used for the solution used for posttreatment.
[3] "Finishing" means that this was the final treatment step of the printing plate; either a gumming solution 850S ® from Kodak Polychrome Graphics or a mixture of 1 part by volume of this gumming solution and 1 part by volume of a 2 wt.-% solution of the siloxane (II) in the solvent listed under "solvent" was used.
[4] Steps of an UGRA Offset test scale 1982 obtained in a fresh plate developed after irradiation.
[5] The relative dot gain was calculated using equation (2) above.

Examples 4 to 6 and Comparative Example 4

Lithographic Printing Plate Precursors with UV-sensitive Photopolymer Layer

A UV-sensitive, filtered coating solution as described in Table 3 was applied to the substrate listed in Table 4 and dried for 4 minutes at 90° C. The dry layer weight of the photopolymer layer was about 1.5 g/m$^2$.

The thus obtained samples were provided with an overcoat layer by coating them with an aqueous solution of poly(vinyl alcohol) (degree of hydrolysis 88%); after drying for 4 minutes at 90° C., the overcoat layer had a dry layer weight of about 3 g/m$^2$.

The printing plate precursor was exposed with a Creo Trendsetter image-setter emitting at 830 nm (120 mJ/cm$^2$). A UGRA digital gray scale with defined tonal values (all data was linearized in order to approximately obtain the desired tonal value) was exposed onto the plate precursor described above. Immediately after exposure, the plate was heated in an oven for 1 minute to 120° C.

Then the exposed and thermally treated plate was treated for 30 seconds with developer 980® from Kodak Polychrome Graphics. Then the developer solution was again rubbed over the surface for another 30 seconds using a tampon and then the entire plate was rinsed with water. After this treatment, the exposed portions remained on the plate.

TABLE 3

| | |
|---|---|
| 4.87 g | of a terpolymer of styrene, methylmethacrylate and methacrylic acid, 30% solution in Dowanol PM (acid number 120 mg KOH/g) |
| 1.46 g | Ioncryl 683 ® (acrylic resin from SC Johnson & Sons Inc.; acid number 160 mg KOH/g) |
| 0.15 g | mercapto-3-triazole |
| 4.03 g | of an 80% methyl ethyl ketone solution of a urethane acrylate prepared by reacting Desmodur N 100 ® with hydroxyethyl acrylate and pentaerythritol triacrylate; amount of double bonds: 0.5 double bonds per 100 g when all isocyanate groups have completely reacted with the acrylates containing hydroxy groups |
| 0.67 g | ditrimethylolpropane tetraacrylate |
| 0.07 g | IR dye 66e 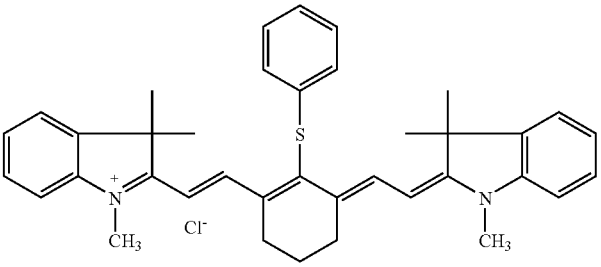 1,3,3-trimethyl-2-(2-{2-phenylsulfanyl-3-[2-(1,3,3-trimethyl-1,3-dihydro-indole-2-ylidene)-ethylidene]-cyclohexo-1-enyl}-vinyl)-3H-indolium chloride |
| 0.19 g | phenylimino diacetic acid |
| 0.36 g | 2,6-trichloromethyl-6-(4-methoxyphenyl)-1,3,5-triazine |
| 0.09 g | Basonyl Violet 610 |
| 32 ml | Dowanol PM |
| 4 ml | acetone |

The developed plates were treated according to the present invention with a siloxane solution; for this purpose, the entire plate, i.e. image areas and non-image areas, was carefully rubbed with a tampon moistened with the corresponding siloxane solution and then dried at room temperature. Then an aqueous gumming solution (0.5% $H_3PO_4$, 6% gum arabic) was applied using standard processes.

Details regarding the substrates, siloxanes, solvents for the siloxane solutions and gumming used in the examples as well as the results obtained with respect to relative dot gain can be inferred from Table 4.

In Example 6, the developed plate was treated with a gumming solution which also contained the siloxane solution, i.e. post treatment and gumming were carried out in a single step. Details can be inferred from Table 4 as well.

The relative dot gain and the sensitivity were determined as described in Examples 1 to 3.

TABLE 4

| Example | Substrate | Post-treatment[1] | Solvent[2] | Finishing[3] | Relative dot gain[5] (relative area) |
|---|---|---|---|---|---|
| Comp. 4 | Substrate 1 | none | — | Gumming | 100 |
| 4 | Substrate 2 | 2% Siloxane | $H_2O$ | Gumming | 3 |
| 5 | Substrate 2 | 1% Siloxane | $H_2O$ | Gumming | 2 |
| 6 | Substrate 2 | none | — | Gumming + Siloxane | 5 |

[1]"Posttreatment" means that the developed plate was treated with an aqueous solution of the mentioned compound. The siloxane used was prepared according to the reference example and had the following structure:

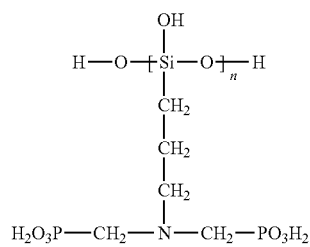

(II)

[2]The listed solvent was used for the solution used for the posttreatment.

[3]"Finishing" means that this was the final treatment step of the printing plate; either a gumming solution 850S ® from Kodak Polychrome Graphics or a mixture of 1 part by volume of this gumming solution and 1 part by volume of a 2 wt.-% solution of the siloxane (II) in the solvent listed under "solvent" was used.

Figure 3:
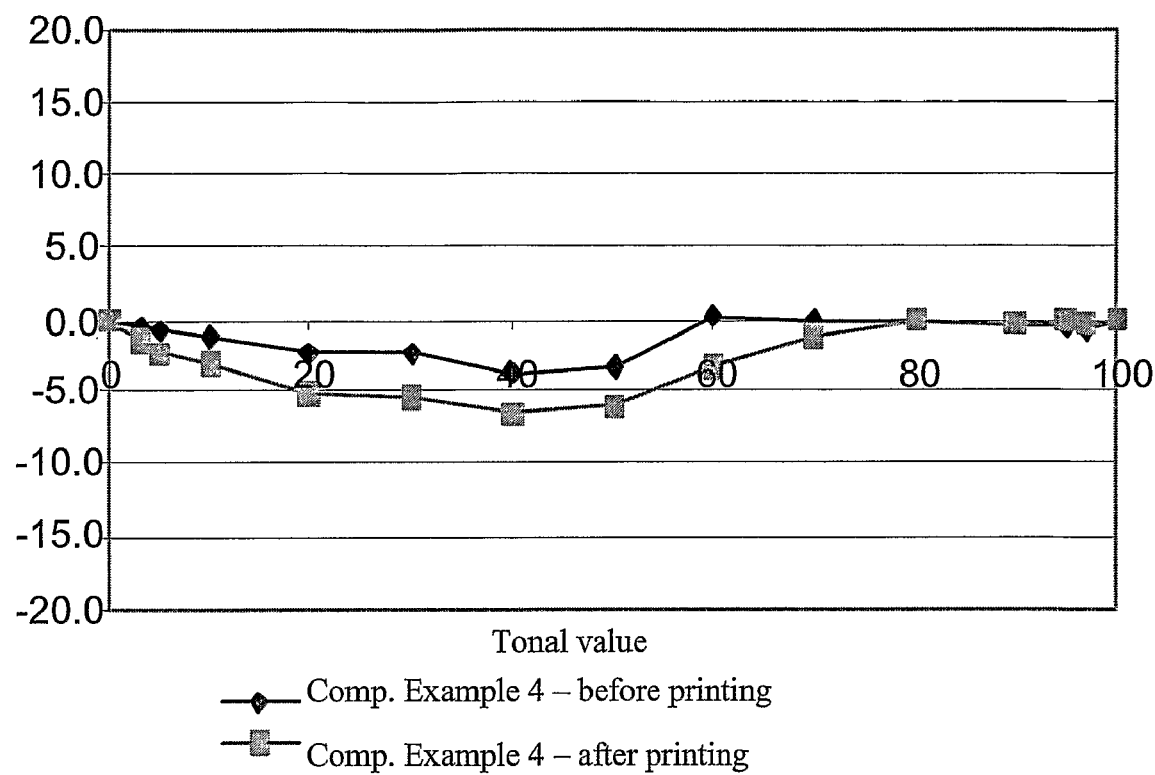
Figure 4:
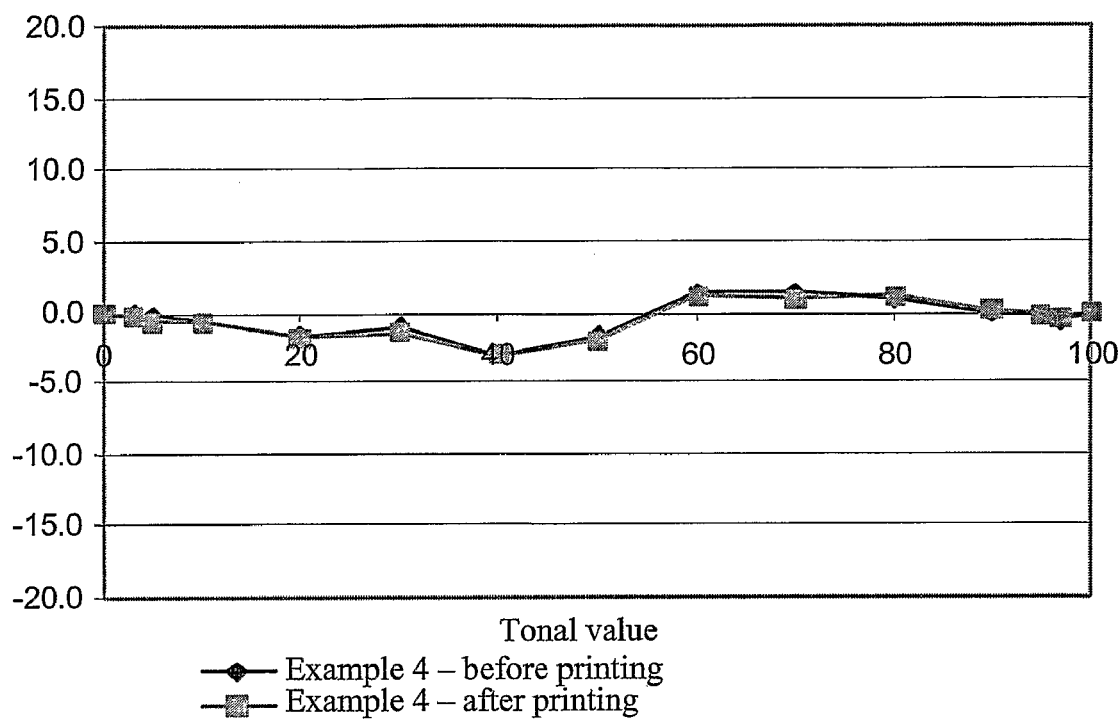
Figure 5:
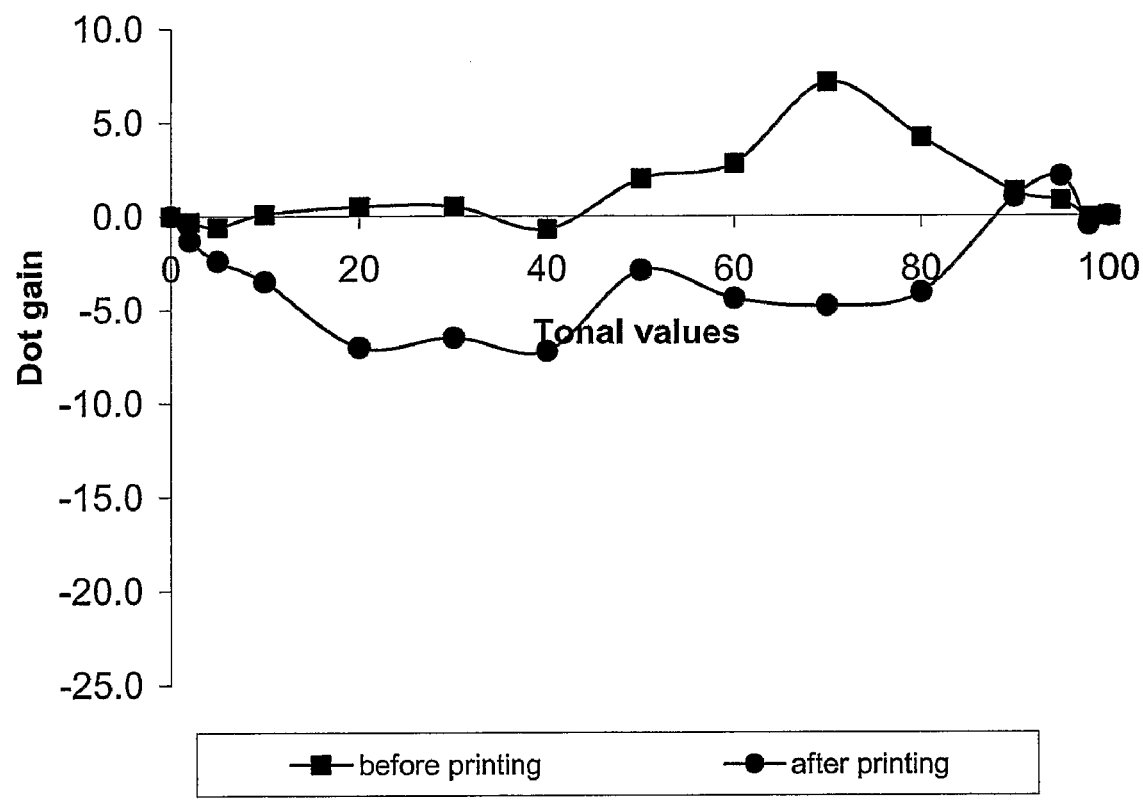
Figure 6:
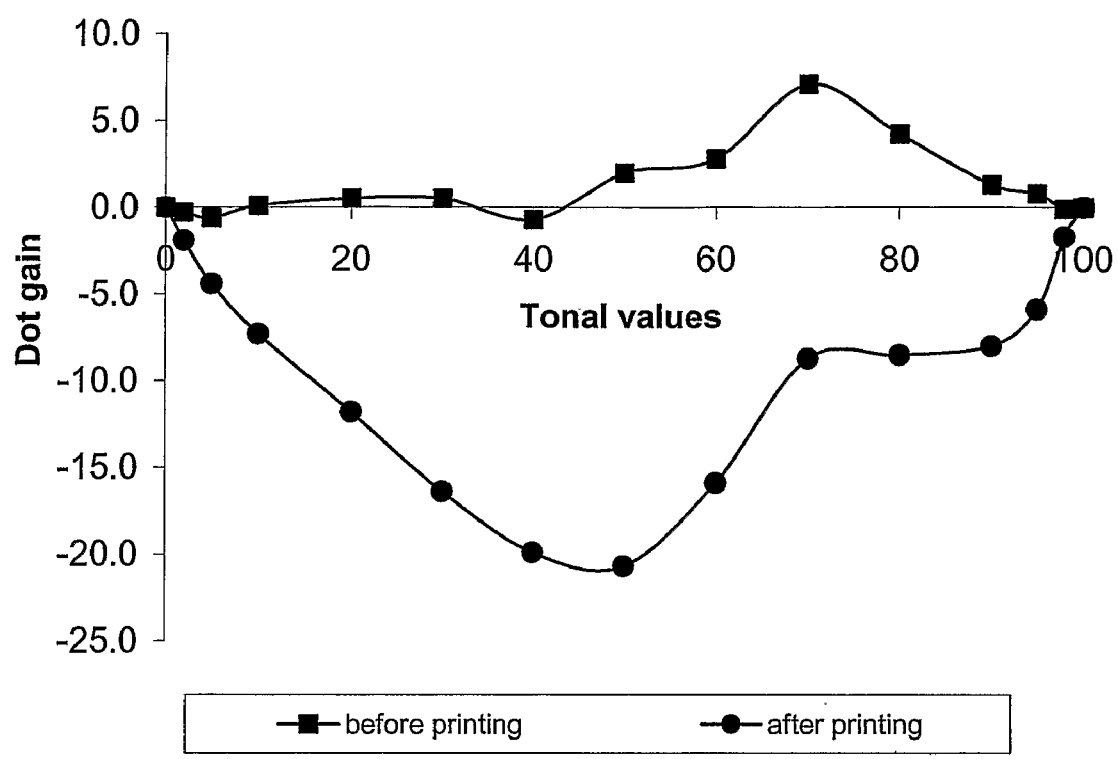

FIGS. 3 and 4 graphically illustrate the dot gain at different tonal values before printing and after 10,000 runs on the printing machine (i.e. 10,000 copies) for Comparative Example 4 and Example 4. The relative dot gain in FIG. 3 (Comparative Example 4) was assumed to be 100%; the relative dot gain in FIG. 4 (Example 4) was calculated to be only 3%.

The plates of Examples 4 to 6 were furthermore subjected to a storage stability test; for this purpose, the printing plate precursors were stored for 90 minutes at 88° C. The aged plate precursors were then imaged and compared with fresh plate precursors with respect to sensitivity and behavior on the printing machine; no significant differences were observed.

Example 7 and Comparative Example 5

As described in Comparative Example 1 and Example 3, two printing plate precursors were produced. The printing plate precursors were exposed with a Heidelberg Prosetter equipped with a diode emitting at 405 nm (P=30 mW). The test image was exposed onto the plate at a resolution of 2540 dpi in a 20μ FM screen (Heidelberg Diamond). The plate was then developed with an alkaline developer as described analogously in Examples 1 to 4 and then subjected to a finishing treatment. After 10,000 prints, the plate of Example 7 which was produced with Substrate 2 showed a much lower shift in the tonal values (see FIG. 5) than the plate of Comparative Example 5 produced with Substrate 1 (see FIG. 6). The results are summarized in Table 5.

TABLE 5

| Example | Substrate | Posttreatment | Finishing[1] | Relative dot gain[2] |
|---|---|---|---|---|
| Comp. 5 | Substrate 1 | none | Gumming 850 S | 100 |
| 7 | Substrate 2 | none | Siloxane + Gumming 850 S | 36 |

[1]"Finishing" means that this was the final treatment step of the printing plate; either a gumming solution 850S ® from Kodak Polychrome Graphics or a mixture of 1 part by volume of this gumming solution and 1 part by volume of a 4 wt.-% solution of the siloxane of formula (II);
[2]The relative dot gain was calculated on the basis of equation (2) above.

The Example shows that even small structural elements as they occur in the 20μ FM screen show a much more favorable behavior during printing on Substrate 2 than those on Substrate 1. Toning of the plate produced with Substrate 2 can be prevented if the plate is subjected to a Post treatment with the siloxane mentioned in the present invention.

The invention claimed is:

1. A process for the production of a lithographic printing plate comprising;
   (a) image-wise irradiating a lithographic printing plate precursor having a radiation-sensitive layer applied to a lithographic substrate;
   (b) removing the non-image areas from the image-wise irradiated precursor by means of an alkaline developer;
   (c) treating the lithographic printing plate obtained in step (b) with a solution comprising at least one phosphono-substituted siloxane of the general formula (I)

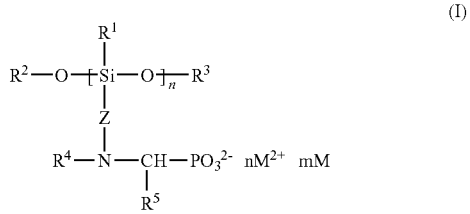

(I)

wherein
- $R^1$ is selected from a hydrogen atom, a hydroxy group, a liner or branched $C_1$-$C_{20}$ alkyl, linear or branched $C_2$-$C_{20}$ alkenyl, linear or branched $C_1$-$C_{20}$ alkoxy, liner or branched $C_2$-$C_{20}$ alkinyl, aryl, arylalkyl, alkylaryl, arylalkenyl, alkenylaryl, arylalkinyl, alkinylaryl, acyloxy group and a group —$CHR^6$—$PO_3^{2-}$,
- $R^2$ and $R^3$ are independently selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, and alkinylaryl group,
- $R^4$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- $R^5$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- Z represents —$(CR^6R^7)_x$— or arylene, or a combination of two or more thereof,
- $R^6$ and $R^7$ are independently selected from a hydrogen atom, a linear or branched $C_1$-$C_6$ alkyl, linear or branched $C_2$-$C_6$ alkenyl, linear or branched $C_2$-$C_6$ alkinyl, aryl, arylalkyl, alkylaryl, arylalkenyl, alkenylaryl, arylalkinyl and alkinylaryl group,
- n is an average value and has a value from 1 to 200 and
- x is an integer from 1 to 100,
- M represents the counterion(s) needed for charge equalization and is selected from monovalent, divalent or multivalent cations, and
- m is the number of cations needed for charge equalization; and
- (d) drying.

2. The process according to claim 1, further comprising
(e) treating the post-treated lithographic printing plate obtained in step (d) with a gumming solution, or the solution used in step (c) further comprises a gumming agent.

3. A process for the production of a lithographic printing plate comprising;
(a) image-wise applying a composition that is oleophilic in the dry state onto a lithographic substrate, resulting in printing image areas;
(b) treating the lithographic printing plate obtained in step (a) with a solution comprising at least one phosphono-substituted siloxane of the general formula (I)

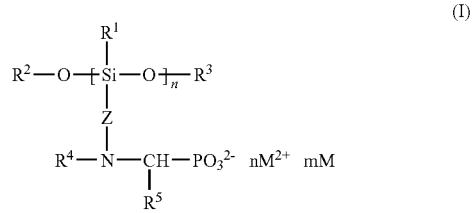

(I)

wherein
- $R^1$ is selected from a hydrogen atom, a hydroxy group, a linear or branched $C_1$-$C_{20}$ alkyl, linear or branched $C_2$-$C_{20}$ alkenyl, linear or branched $C_1$-$C_{20}$ alkoxy, linear or branched $C_2$-$C_{20}$ alkinyl, aryl, arylalkyl, alkylaryl, arylalkenyl, alkenylaryl, arylalkinyl, alkinylaryl, acyloxy group and a group —$CHR^6$—$PO_3^{2-}$,
- $R^2$ and $R^3$ are independently selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, and alkinylaryl group,
- $R^4$ selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- $R^5$ is selected from a hydrogen atom, a linear or branched $C_1$-$C_{20}$ alkyl, linear or branched $C_2$-$C_{20}$ alkenyl, linear or branched $C_2$-$C_{20}$ alkinyl, aryl, arylalkyl, alkylaryl, arylalkenyl, alkenylaryl, arylalkinyl, alkinylaryl group and the group —$CHR^6$—$PO_3^{2-}$,
- Z represents —$(CR^6R^7)_x$— or arylene, or a combination of two or more thereof,
- $R^6$ and $R^7$ are independently selected from a hydrogen atom, a liner or branched $C_1$-$C_6$ alkyl, linear or branched $C_2$-$C_6$ alkenyl, linear or branched $C^2$-$C_6$ alkinyl, aryl, arylalkyl, alkylaryl, arylalkenyl, alkenylaryl, arylalkinyl and alkinylaryl group,
- n is an average value and has a value from 1 to 200 and
- x is an integer from 1 to 100,
- M represents the counterion(s) needed for charge equalization and is selected from monovalent, divalent or multivalent cations, and
- m is the number of cations needed for charge equalization; and
- (c) drying.

4. The process according to claim 3, further comprising
(d) treating the lithographic printing plate obtained in step (c) with a gumming solution, or the solution used in step (b) further comprises a gumming agent.

5. The process according to claim 1 wherein the phosphono-substituted siloxane is present in the solution in a concentration of 0.01 to 15 wt.-%.

6. The process according to claim 1 wherein the lithographic substrate comprises an aluminum foil or plate, a laminated material made from a plastic film and aluminum foil or paper and aluminum foil, or a plastic film onto which aluminum has been deposited by means of vapor deposition.

7. The process according to claim 1 wherein the siloxane has the general structure (II), wherein n is an average value and has a value of 1 to 100

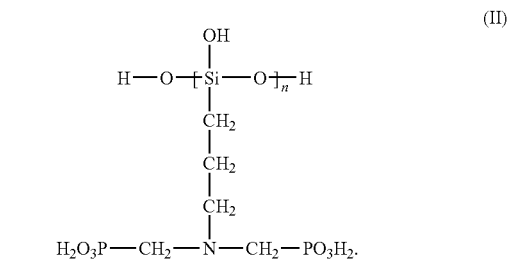

(II)

8. The process according to claim 1 wherein mM=2 H⁺.

9. The process according to claim 1 wherein the radiation-sensitive layer is a UV/VIS-sensitive layer sensitive to radiation from a wavelength selected from the range of 320 to 750 nm.

10. The process according to claims 1 wherein the radiation-sensitive layer is an IR-sensitive layer sensitive to radiation from a wavelength selected from the range of more than 750 to 1,600 nm.

11. A process for the post-treatment of an imaged lithographic printing plate comprising;
   (a) bringing a lithographic printing plate comprising image areas and non-image areas on a lithographic substrate into contact with a solution comprising a phosphono-substituted siloxane as defined in claim 1, and
   (b) drying.

12. The process according to claim 7 wherein the phosphono-substituted siloxane is present in the solution in a concentration of 0.01 to 15 wt.-%.

13. The process according to claim 7 wherein the printing plate does not comprise an interlayer between the lithographic substrate and the radiation-sensitive layer.

* * * * *